United States Patent [19]

Axon et al.

[11] Patent Number: 4,992,354

[45] Date of Patent: * Feb. 12, 1991

[54] DRY FILM PHOTORESIST FOR FORMING A CONFORMABLE MASK AND METHOD OF APPLICATION TO A PRINTED CIRCUIT BOARD OR THE LIKE

[75] Inventors: Frederick J. Axon, Manchester, England; James J. Briguglio, Newport Beach, Calif.; Amedeo Candore, Bodio Lomnago, Italy; Lawson Lightfoot, Chesire, England; Clancy P. Crooks, Cypress; Leo Roos, Laguna Beach, both of Calif.

[73] Assignee: Morton International, Inc., Chicago, Ill.

[*] Notice: The portion of the term of this patent subsequent to Dec. 26, 2006 has been disclaimed.

[21] Appl. No.: 264,472

[22] Filed: Oct. 28, 1988

Related U.S. Application Data

[63] Continuation-in-part of Ser. No. 160,895, Feb. 26, 1988, Pat. No. 4,889,790.

[51] Int. Cl.$^5$ ............................................. G03C 11/12
[52] U.S. Cl. .................................. 430/258; 430/259; 430/319; 430/327; 430/330
[58] Field of Search ............... 430/262, 263, 258, 327, 430/328, 330, 319, 259

[56] References Cited

U.S. PATENT DOCUMENTS

| | | | |
|---|---|---|---|
| 4,127,436 | 11/1978 | Friel | 156/630 |
| 4,318,975 | 3/1982 | Kuznetsov et al. | 430/260 |
| 4,360,570 | 11/1982 | Andreades et al. | 428/596 |
| 4,530,896 | 7/1985 | Christensen et al. | 430/155 |

Primary Examiner—Jose Dees
Attorney, Agent, or Firm—Wayne E. Nacker; Gerald K. White

[57] ABSTRACT

A dry film for forming a solder mask includes a cover sheet, a photoimageable composition layer which is curable to form a solder mask and a top coat interposed between the cover sheet and the photoimageable composition layer which is selectively adherent to the photoimageable composition layer. The dry film is applied to a surface of a printed circuit board with a minor portion of the area of the photoimageable composition layer tacked to the printed circuit board. The cover sheet is peeled away. With heat and vacuum, the photoimageable composition layer is laminated to the irregular surface of the printed circuit board, conforming the photoimageable composition layer to the contours thereof and leaving the top coat as a protective covering over the photoimageable composition layer. The photoimageable composition layer is exposed to patterned actinic radiation, developed and cured to form a hard, permanent solder mask.

13 Claims, 7 Drawing Sheets

PRIOR ART
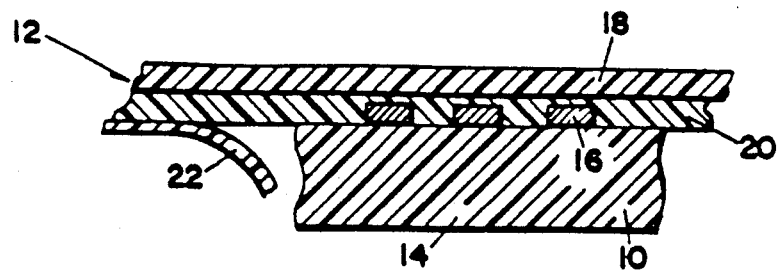
Fig. 1
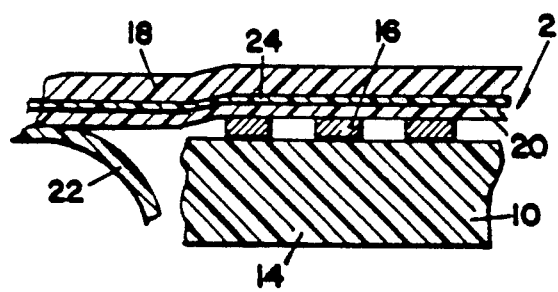 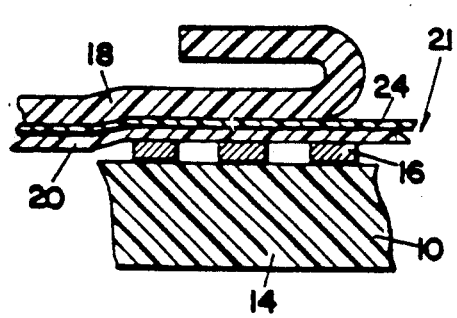
Fig. 2A  Fig. 2B
PRIOR ART  PRIOR ART
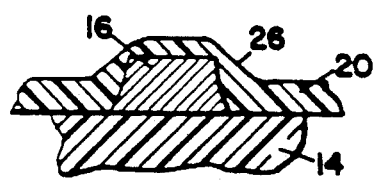 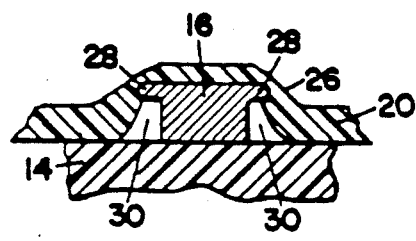
Fig. 3A  Fig. 3B

PRIOR ART

DRY FILM PHOTORESIST FOR FORMING A CONFORMABLE MASK AND METHOD OF APPLICATION TO A PRINTED CIRCUIT BOARD OR THE LIKE

This application is a continuation-in-part of U.S. patent application Ser. No. 07/160,895 filed Feb. 26, 1988, now U.S. Pat. No. 4,889,790.

The present invention is directed to dry films which form masks that conform to irregular surfaces and a method of forming such conformable masks. One aspect of the present invention is directed to a dry film which includes a photoimageable layer which is developable and curable to form a permanent solder mask over a printed circuit board or the like and to a method of forming a solder mask on a printed circuit board or the like using the dry film.

BACKGROUND OF THE INVENTION

A solder mask is a hard, permanent layer of non-conductive material which covers the surface of a printed circuit board or the like, encapsulating the traces of the printed circuit itself. By solder mask is meant herein a hard, permanent layer which meets the abrasion resistance tests as defined in IPC-SM-840A, Table 12, Summary of Criteria for Qualification/Conformance (Institute for Interconnecting and Packaging Electronic Circuits). The solder mask is patterned to fully cover the circuitry, except for those portions intended to be exposed, e.g., for soldering to another component. Solder masks are typically formed from a layer of photoimageable composition which is applied to a surface of the printed circuit board. The photoimageable layer is exposed to actinic radiation which is patterned by means of a template or artwork. Subsequent to exposure, the photoimageable layer is developed in an organic solvent or an aqueous solution which washes away either exposed or unexposed portions of the layer (depending upon whether the photoimageable material is positive acting or negative acting). The portion of the layer which remains on the surface is then cured, e.g. with heat and/or UV light to form a hard, permanent solder mask intended to protect the printed circuitry for the life of the board.

One prior art method of applying the layer of photoimageable composition to the circuit board surface is to apply the material in liquid form and then either allow it to dry or partially cure the material to form a semi-stable layer.

There are a number of advantages to applying a photoimageable layer to a circuit board as a dry film rather than as a liquid. In particular, dry films are free of organic solvent and therefore eliminates this hazard from the workplace and eliminate the need for apparatus to protect the immediate work environment and the more general environment from organic solvent emissions. Typically, a dry film comprises a cover sheet of support material which is somewhat flexible but which has sufficient rigidity to provide structure to a layer of photoimageable composition which overlies one surface of the cover sheet. Typically, the cover sheet is formed of polyester material, such as polyethylene terephthalate (PET), such as that sold as MELINEX ®.

To protect the photoimageable layer and to enable the dry film to be rolled, it is conventional that the exposed surface of the photoimageable layer be covered with a removable protective sheet e.g., a sheet of polyethylene. An example of such a dry film is sold as LAMINAR DM ® by the Dynachem Division of Morton Thiokol, Inc.

The method of use of such a prior art dry film is generally as follows. The protective sheet is removed from the photoimageable composition layer immediately prior to application of the dry film to the surface of the printed circuit board. This may be accomplished, for example, using automated apparatus which peels away and rolls up the protective sheet as the dry film is unrolled from a reel. The dry film is applied to the surface of the circuit board with the photoimageable layer in direct contact with the board surface. Using heat, vacuum and mechanical pressure, the photoimageable layer is immediately laminated to the surface of the board. The cover sheet remains overlying the photoimageable layer, protecting the photoimageable layer from exposure to oxygen and from handling damage. The cover sheet also permits an artwork (or template) to be laid directly on top of the dry film for contact printing, if contact printing is to be used (as is usually preferred from the standpoint of obtaining optimal image resolution). The dry film is exposed to patterned actinic radiation through the PET cover sheet. At this time, the PET support sheet is removed, permitting access to the exposed photoimageable layer by developer. Depending upon the composition of the photoimageable layer, the photoimageable layer is developed with organic solvent, aqueous developer, or semi-aqueous developer. By semi-aqueous developer is meant herein a developer which is about 90% or more by volume aqueous solution, balance an organic solvent, such as, 2-butoxy ethanol and other glycol ethers. The photoimageable layer may either be positive acting, in which case the exposed portions are removed by developer, or negative acing, in which case the unexposed portions are removed by developers. Most photoimageable layers for preparing solder masks are negative acting. Most photoimageable composition layers require some cure subsequent to development to render the layer hard and permanent so as to serve as a solder mask. Depending upon the composition of the photoimageable layer, curing may be effected with heat and/or UV light.

Although a number of advantages accrue through the use of dry films as opposed to coating the circuit board with a liquid composition, there are some problems with solder mask-forming dry films which the present invention addresses.

Because the cover sheet of a conventional dry film is relatively rigid, the photoimageable layer cannot fully conform to the irregular contours of the printed circuit board, from which circuitry traces rise from the flat surface of the board itself. Because of this, the thickness of the photoimageable layer must be slightly greater than the elevation of the traces above the surface of the board. For example, if the traces rise $75\mu$ above the surface of the board, the photoimageable layer will typically be about $100\mu$ thick; when laminated to the board, approximately $25\mu$ of photoimageable composition overlies the upper surfaces of the traces.

One unfortunate result of the solder mask being thicker than the elevation of the traces is that elevated regions of solder mask exist between those portions of the circuitry from which photoimageable composition is removed during the development of the solder mask, e.g. those portions of the traces to which a component is to be soldered. Elevated regions are particularly problematic with respect to components which are surface-mounted to the printed circuit board. Components typically contain a plurality of pins which are each to be soldered to an exposed portion of a trace of the circuit board. If the component does not fit closely to the board, it may rest on the surface of photoimageable composition without adequate bonding being established between the pins and the traces. It would be desirable if low regions, or "valleys", rather than elevated regions existed between exposed trace portions.

Some common traces are narrower at the foot than at the top, in which case small overhangs extend outward along each side of each trace (an effect known as "mushrooming"). With both liquid compositions and conventional dry films, there inherently remains air-filled voids below such overhangs. The air trapped in such voids may produce some oxidation of the traces and may lead to eventual defects in the solder mask.

The present invention is directed to an improved dry film for forming a solder mask which eliminates some of the problems of both liquid application and conventional dry films. The present invention is also directed to a method of using a dry film to apply a photoimageable layer, which may be one which forms a solder mask or may be a primary imaging photoresist, to a surface, particularly an uneven surface. Dry film carrying a primary imaging resist may be applied by the method of the present invention, providing excellent conformation for tab plating operations.

SUMMARY OF THE INVENTION

In accordance with one aspect of the invention, there is provided a dry film for forming a solder mask on a printed circuit board or the like. The dry film includes a cover sheet formed of flexible, but generally non-conforming material, giving the dry film shape while allowing it to be rolled into a reel. On one surface of the cover sheet is a thin layer of material, referred to herein as a top coat, which is preferably soluble in the developer for the photoimageable composition. The photoimageable composition forms a layer over the other surface of the top coat. A removable sheet (which is optional, but highly preferred) protects the photoimageable composition layer. The material which is used to form the top coat is selectively adherent to the photoimageable composition layer relative to its adherence to the cover sheet, whereby the cover sheet may be removed from the top coat and thereby leave the top coat as a protective covering for the layer of photoimageable composition.

To form a solder mask in accordance with one aspect of the present invention, the protective, removable sheet of the dry film is peeled away, and the exposed surface of the photoimageable composition layer is tacked to a minor portion of the surface of the printed circuit board. The cover sheet is removed, leaving the top coat as a protective covering on the layer of photoimageable composition. At this time, the layer of photoimageable composition is firmly laminated to the surface of the board with the use of heat, vacuum, and mechanical pressure, conforming the photoimageable composition layer to the contours of the board surface and substantially encapsulating the traces. The photoimageable composition layer is then exposed to patterned actinic radiation through the top coat. A developer is used to remove either exposed or non-exposed portions of the photoimageable composition layer, leaving the remaining portion of the layer laminated to the circuit board. Subsequently, the portions of the photoimageable composition layer remaining on the circuit board are cured, e.g., with heat and/or UV light. A similar process is useful for applying and developing a conformable primary imaging photoresist layer, although heat and UV curing are not used.

In accordance with a modified aspect of the present invention, after the photoimageable composition layer is tacked to a minor portion of the surface of the board, e.g., along the leading and trailing edge, the dry film is laminated with heat, vacuum and mechanical pressure to the board. The cover sheet is then removed. At this time, the remaining layers of the dry film are again vacuum laminated with heat, vacuum and mechanical pressure to conform the remaining layers of the dry film to the contours of the board surface. Usually, the second lamination is carried out for a shorter period of time.

In accordance with another variation of the present invention, after the photoimageable composition layer is tacked to a minor portion of the surface of the board, e.g., along the leading and trailing edge, the dry film is laminated with heat, vacuum and mechanical pressure to the board. The cover sheet is then removed. At this time, the remaining layers of the dry film are conformed to the contours of the board by mechanical pressure supplied by heated rollers which pass across the surface of the board.

BRIEF DESCRIPTION OF THE DRAWINGS

FIG. 1 is a cross-sectional view of a conventional dry film used for forming a solder mask, shown being applied to a printed circuit board.

FIG. 2A is a cross-sectional view of a dry film in accordance with the invention used for forming a solder mask.

FIG. 2B shows removal of the cover sheet from a dry film tacked to a printed circuit board.

FIG. 3A is a cross-sectional view of a trace on a printed circuit board covered by a solder mask formed from a prior art, liquid photoimageable composition.

FIG. 3B is a cross-sectional view of an alternative trace on a printed circuit board covered by a solder mask formed from a prior art, liquid photoimageable composition.

FIG. 6 is a 300× magnification of a 50μ trace covered with a 50μ solder mask. FIG. 7 is a 750× magnification of a 75μ trace covered with a 50μ solder mask. FIG. 8 is a 300× magnification of a 50μ trace having lateral overhangs and being covered with a 50μ solder mask. FIG. 9 is a 100× magnification of 50μ traces covered with a 50μ solder mask.

DETAILED DESCRIPTION OF CERTAIN PREFERRED EMBODIMENTS

Figure 4A:
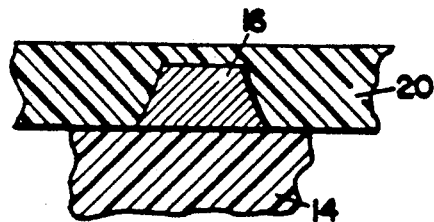
FIG. 4A is a cross-sectional view of a trace on a printed circuit board covered by a solder mask formed from a prior art, conventional dry film.

Illustrated in FIG. 1 is an illustration of a circuit board 10 being covered with a prior art dry film 12. The circuit board comprises a board 14 of non-conductive material, e.g., formed of epoxy, and the conductive traces 16 which comprise the printed circuit. The dry film comprises a cover sheet 18 of flexible, but generally non-conforming material, typically a polyester, such as a polyethylene terephthalate, a layer 20 of photoimageable material which eventually is processed to become the solder mask and a protective sheet 22 formed, for example, of polyethylene.

Figure 11:
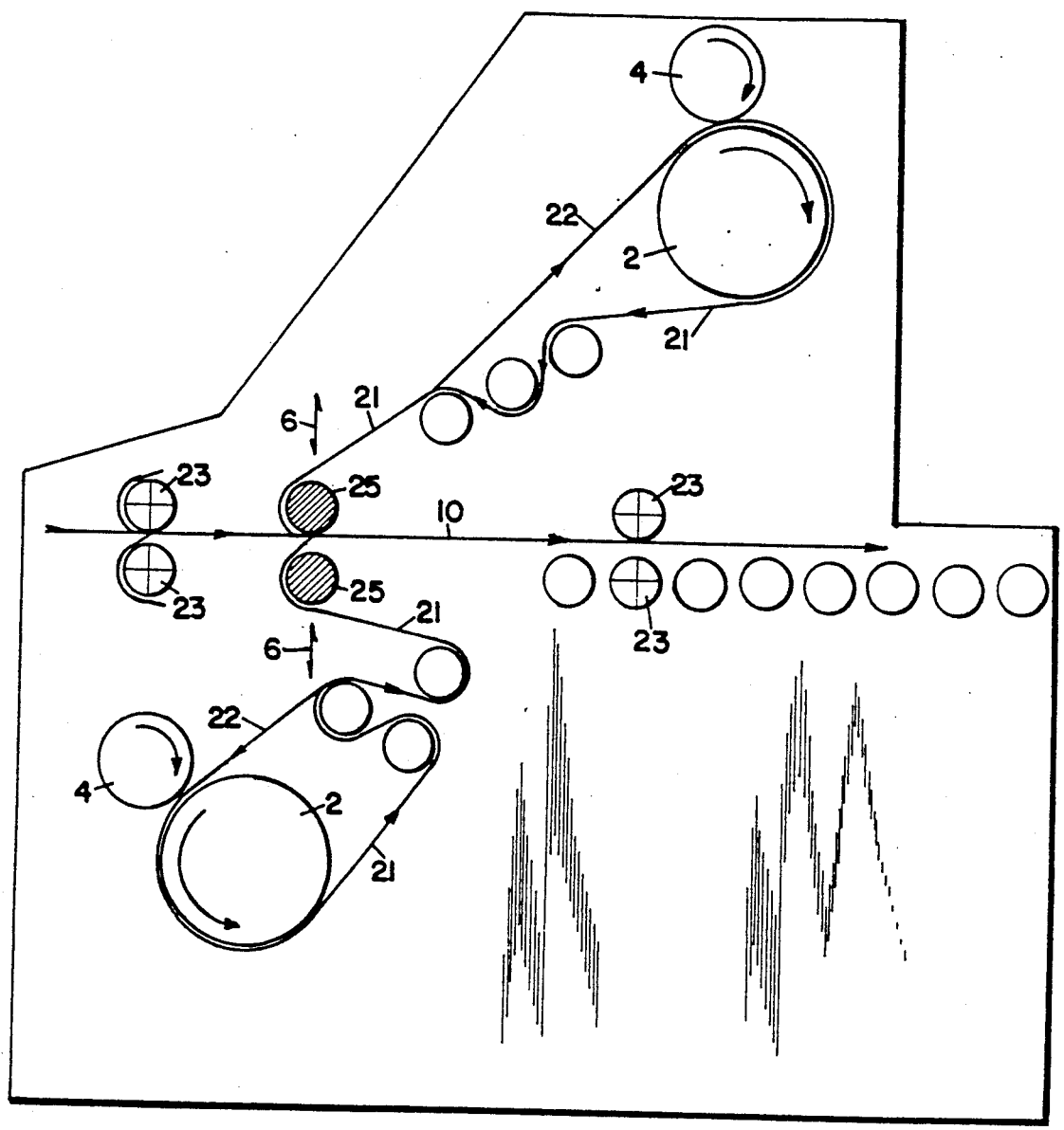
FIG. 11 is a diagrammatic illustration of the use of roller apparatus to tack down a dry film to a board.

Typically the dry film is supplied from a reel 2 (FIG. 11) to the circuit board 10. Just prior to application to the surface of the circuit board, the protective sheet 22 is peeled away, as shown, e.g., by rolling onto a take-up reel 4 (FIG. 11). As the photoimageable layer is applied to the surface of the circuit board 10, it is laminated thereto with heat, mechanical pressure and vacuum. Although the cover sheet 18 is flexible, it is non-conforming and therefore retains its flat configuration when the dry film 12 is applied to the circuit board 10. The photoimageable composition layer 20 during lamination conforms at its contact surface to the circuit board from which the traces 16 protrude; however, the surface of the photoimageable composition layer which is in contact with the cover sheet 18 remains flat. In order that the photoimageable composition layer 20 may fully encapsulate the traces 16, it must be thicker than the elevation of the traces above the board 14 of non-conductive material. Standard requirements are that the thickness of the solder mask over all portions of the traces be at least 18μ. Because the great majority of traces are elevated 50μ or more above the surface of the board 14, the photoimageable composition layer must usually be 68μ or thicker. Conventional dry films 12 for forming a solder masks typically have photoimageable layers 100μ thick.

Illustrated in FIG. 2A is a dry film 21 in accordance with the present invention. This dry film 21 also includes a cover sheet 18, a layer 20 of photoimageable composition which is processable to form a hard, permanent solder mask and an optional, but preferred, protective sheet 22. In addition, the dry film 21 includes a top coat 24 intermediate the cover sheet 18 and the photoimageable composition 20. The material for the top coat 24 is selected to have selective adherence to the photoimageable composition layer 20 relative to its adherence to the cover sheet 18, whereby the cover sheet may be peeled away from the remaining layers 20, 24 of the circuit board-adhered dry film leaving the top coat 24 protecting the photoimageable composition layer 20. The top coat 24 is formed of material which also is selected for oxygen-impermeability, whereby it protects the underlying layer of photoimageable composition 20 from oxygen inhibition during free radical photopolymerization in the exposure step. Preferably, the top coat is also selected to be soluble in the developer for the photoimageable composition, whereby the top coat is removed during the development process. It is possible, however, that the top coat not be soluble in the developer, in which case the top coat must be removed in a predevelopment step. The top coat material is further selected for transparency, strength and flexibility.

Dry film for applying photoresist layers having a similar configuration are described in the U.S. Pat. No. 4,530,896 issued July 23, 1985 to Christensen et al. and in U.S. patent application Ser. No. 06/931,396 filed Nov. 14, 1986, the teachings of each being incorporated herein by reference. U.S. Pat. No. 4,530,896 is limited to application of very thin resist coatings. Primary photoresists are typically applied to a metal-covered substrate in order to define the pattern of circuitry traces on a printed circuit board. In each of these references, a dry film is described having, in order, a cover sheet, an intermediate layer which acts as a top coat after removal of the cover sheet, a photoresist composition layer and an (optional) protective sheet.

Although the order of layers are similar to those of the dry film of the present invention, there are several reasons why it would not be obvious to one with ordinary skill in the art that there would be advantages to a solder mask-forming dry film of similar laminate arrangement.

It is a major advantage in a dry film for applying a primary imaging photoresist layer to a substrate that the relatively thick cover sheet be removed prior to imaging, thereby substantially improving the resolution of the imaging which may be achieved. Although, similar advantages of resolution are obtained, in fact, with a solder mask-forming dry film, resolution of image is of substantially less concern with solder masks than with primary photoresists.

The main advantages of a solder mask dry film having this laminate arrangement are achieved through the application of the solder mask by the novel process of the present invention. The novel process of the present invention closely conforms the photoimageable composition layer 20, which eventually forms the solder mask, to the contours of a circuit board surface which are irregular due to the elevated traces. In contrast, a primary imaging photoresist layer is usually applied to a substantially flat surface. By conforming the photoimageable composition layer 20 closely to the circuit board surface, excellent encapsulation of the traces 16 is achieved. Also, a much thinner photoimageable composition layer 20 may be used than has been used in prior art, solder mask-forming dry films.

As in the case with the conventional dry film 12, the protective sheet 22 is initially peeled from the photoimageable composition layer is applied over a surface of the printed circuit board as seen in FIG. 2A. Unlike the case with the conventional dry film 12, the dry film 21 in accordance with one aspect of the present invention may not be fully laminated to the board at the time of application. Rather, slight pressure is used to tack the dry film 21 to the board. Either cold-tacking or hot-tacking may be used. By cold-tacking is generally meant at room temperature, e.g., 20°–25° C. Hot-tacking may be at temperatures up to about 70° C. In accordance with one aspect of the invention, the dry film 21 is not tacked to the entire surface, but only to a portion sufficient to provide adequate adherence to the board so as to allow removal of the cover sheet 18 without removal of the remaining layers 20, 24 of the dry film 21 from the circuit board 10. By tacking only a small portion, typically 5% or less of the entire surface area of the dry film which lies over the board, passageways are left between the dry film 21 and the board 10 for subsequent removal of air by application of vacuum. If the dry film is applied by machine, edges, e.g., the leading and trailing edge, may be tacked. If manually applied, tacking at the corners is sufficient. Mechanical pressure, such as that which may easily be provided by a human finger, is sufficient for tacking.

As an example of how tacking may be performed mechanically, reference is again made to FIG. 11. A circuit board 10 is carried from left to right by drive rollers 23, and the dry films 21 are caused to travel in synchronous motion along the surface thereof. Non-driven rollers 25 are reciprocal upward and downward in the direction of double arrows 6 between vertical positions in contact with the dry film and vertical positions remote from the surface. When the leading edge of the board is aligned with the rollers 25, the rollers 25 are brought into contact with the dry film, pressing the dry film onto and tacking the dry film to the leading edge of the board. The rollers 25 are immediately reciprocated away from the board to allow the middle regions of the board to pass thereby untouched by the rollers. The rollers 25 are again reciprocated into contact with the board to tack the dry films 21 to the trailing edge of the board 10.

At this time, the cover sheets 18 are removed. Because only a minor portion of each dry film 21 area is tacked to the circuit board 10, FIG. 2B shows a preferred mode of removal in which the cover sheet 18 is peeled back in a plane parallel to the plane of the circuit board 10 (as opposed to lifting in a generally perpendicular direction which would tend to remove the photoimageable layer 20 from the circuit board 10).

With the cover sheet 18 removed, the photoimageable layer 20 with the top coat 24 thereon is now vacuum-laminated at elevated temperature to the board. A vacuum of at least about 0.3 millibar is used and preferably a vacuum of at least about 1 millibar. Laminating temperatures range from about 40° C. to about 100° C., a range of about 55° C. to about 80° C. being preferred. Because the cover sheet 18 is removed, the two remaining layer (photoimageable layer 20 and top coat 24) conform easily to the contours of the irregular surface of the circuit board 10.

In conventional vacuum laminating, in addition to heat and vacuum, mechanical pressure is brought to bear against the dry film. In what is known as a "slap-down" (FIG. 13) process, a blanket and/or platen is used to press the dry film against the board. Commercial examples of laminators using mechanical pressure in addition to heat and vacuum are models 724 and 730 sold by Dynachem Division of Morton Thiokol, Inc.

Figure 13A:
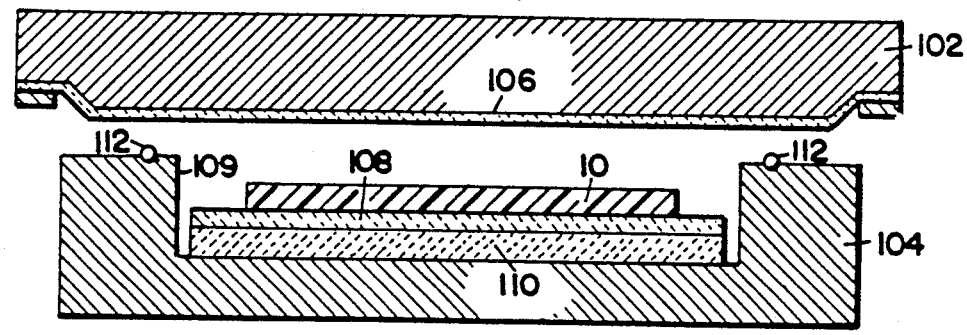
FIGS. 13A, and 13B and 13C illustrate diagrammatically a vacuum applicator and a platen operations sequence thereof.
Figure 13B:
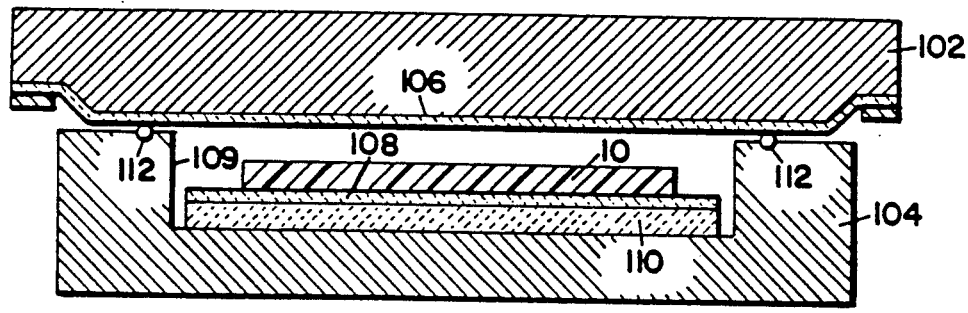
Figure 13C:
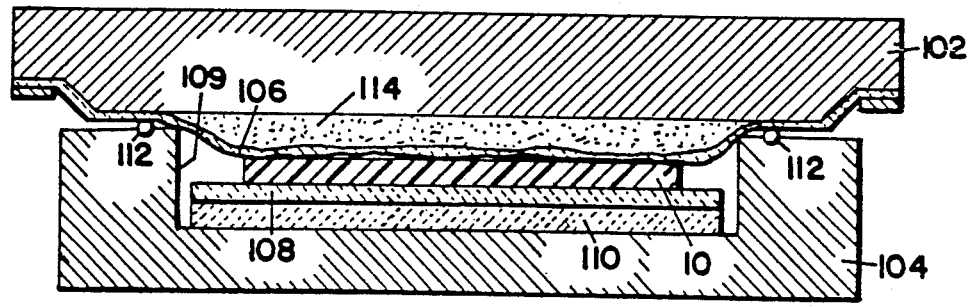

Such vacuum laminating apparatus 100 is briefly described with respect to FIGS. 13A, 13B and 13C. The apparatus includes an upper stationary platen 102 and a lower movable platen 104. Associated with the upper platen 102 is an upper resilient blanket 106; associated with the lower platen 104 is a lower resilient blanket 108. The lower platen 104 has a well 109 for carrying a dry film-covered circuit board 10. Sealing means in the form of an O-ring 112 are provided on the lower platen 104 for hermetically sealing the well 109 when the lower platen is brought into contact with the upper platen 102 and its associated blanket 106. Also shown in FIGS. 13A–13C is a shim 110. The shim is also formed of resilient material and is used to accommodate boards of different thickness. Several shims may be used, including shims interposed between the upper platen 102 and upper blanket 106. Typically the lower platen 104 is reciprocal both horizontally and vertically. With the lower platen 104 out of horizontal alignment with the upper platen 102, the dry film-covered circuit board 10 is placed in the well 109 on top of the lower blanket 108. Then the lower platen 104 is moved vertically into alignment with the upper platen 102, the condition shown in FIG. 13A. Next, the lower platen is moved upward until contact is effected between the O-ring 112 and the upper platen 102 and its associated blanket 106 (FIG. 13B). Not shown are means to apply a vacuum in the region of the well 109 which contains the circuit board 10. Also, not shown are means to provide a vacuum between the upper platen 102 and the upper blanket 106. After the well region 109 has been sealed, vacuum is applied both to the well region 109 and between the upper platen 102 and upper blanket 106. During this time, the circuit board 10 merely rests on the lower blanket 108. The vacuum in the well region 109 serves to remove air from between the dry film layers 20, 24 and the surfaces of the circuit board and to draw the layers of the dry film to the surfaces of the circuit board. For a short period at the end of the cycle, the vacuum is released from between the upper platen 102 and the upper blanket 106. The vacuum in the well region 109 causes the upper resilient blanket 106 to "slap down" against the board 10, pressing the board and dry film layers between the upper and lower blankets 106, 108 as seen in FIG. 13C. Finally, the vacuum is released from the well region 109 and the lower platen 104 is removed vertically and then horizontally from the upper platen 102 to allow removal of the laminated board.

During slap-down, mechanical pressure is conveyed to the dry film by the blankets formed of resilient material. The resilient material of the blankets is a type of rubber, e.g., silicon rubber, or other type of resilient polymeric material. The surface of each blanket which contacts the dry film is conventionally texturized to prevent a vacuum bond from forming between the blanket and the cover sheet. In prior art processes, such a bond would cause the cover sheet and possibly underlying layers to tear away from the board when the platen and blanket are withdrawn. Texturization of the blankets may be in the form of surface roughness of the polmeric material itself or it may be provided by a rough, rubberized fabric at the dry film contact surface. In the process of the present invention wherein soft remaining layers 20, 24 of the dry film 21 are laminated to the board after removal of the cover sheet, conventional blankets with rough contact surfaces have been found to be disadvantageous if that they leave a negative image imprinted on the remaining layers of dry film. To avoid this, new semi-matte blankets have been devised which have a very fine texture. Again, the texture prevents a vacuum bond from being formed between the blanket surface and the remaining layers of the dry film; however, the fine surface texture creates no significant imprint on the remaining, soft layers 20, 24 of the dry film. Preferred blanket material is silicon rubber; preferably reinforced with fabric, such as fiberglass.

During vacuum lamination. The remaining layers 20, 24 conform very closely to the circuit board and provide several advantages which can best be appreciated with respect to FIGS. 3A, 3B, 4A, 4B, 5A, and 5B and the photographs which are FIGS. 6–9. As it turns out, the thin layer which comprises the top coat 24 remains fully intact during the conforming process, a result which would not necessarily have been predictable in advance.

FIG. 3A illustrates a solder mask which was initially applied as a liquid photoimageable composition. Being a liquid, the layer generally conforms to the uneven contours of the circuit board. On the top of each trace 16, the layer is of generally uniform thickness; however, in the regions 26 of the knees of the traces, i.e., the lateral edges, the layer greatly thins out, typically being only about 50% as thick as the portion of the layer which covers the flat upper surface of the trace. Frequently, the layer 20 in the regions 26 of the knees is even thinner relative to the portions of the layer on the flat upper surface of the trace.

Illustrated in FIG. 3B is a solder mask 20 covering a "mushroomed" trace 16' having overhangs 28 on each side. Not only is the solder mask thin in the regions 26 of the knees but a void, air-filled space 30 is left below each overhang 28.

FIG. 4A illustrates a solder mask formed from a photoimageable composition layer 20 of a conventional dry film 12. The outer surface of the solder mask has the flat configuration of the cover sheet 18 which was removed subsequent to lamination, while the laminated surface conforms generally to the irregular contours of the circuit board 10. The solder mask which is shown in FIG. 4A is satisfactory from the standpoint of adequately encapsulating the traces 16. It is to be noted, however, that the thickness of the photoimageable composition layer 20 and solder mask formed therefrom is, of necessity, greater than the elevation of the trace, requiring a relatively large amount of photoimageable composition be used to form the layer. This thickness represents a limitation to the resolution of photoimaging which can be achieved.

Figure 4B:
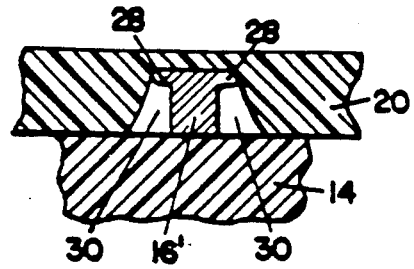
FIG. 4B is a cross-sectional view of an alternative trace on a printed circuit board over which a solder mask formed from a prior art, conventional dry film is applied.

FIG. 4B illustrates a solder mask resulting from a photoimageable layer 20 of a conventional dry film and covering "mushroomed" traces 16' having lateral overhangs 28. Although thickness of the solder mask above the trace 16' is adequate, air-filled voids 30 exist below the overhangs 28.

Figure 5A:
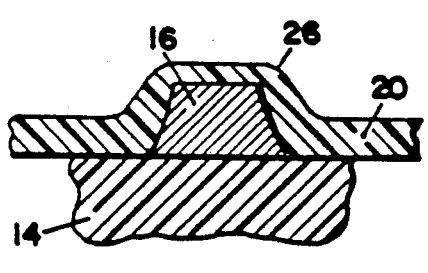
FIG. 5A is a cross-sectional view of a trace on a printed circuit board encapsulated by a solder mask formed from a dry film in accordance with the present invention.
Figure 5B:
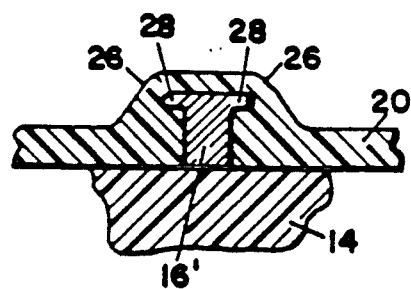
FIG. 5B is a cross-sectional view of an alternative trace on a printed circuit board encapsulated by a solder mask formed from a dry mask in accordance with the present invention.

FIGS. 5A and 5B illustrate solder masks formed from photoimageable composition layers 20 of dry films 21 produced in accordance with the present invention. During the lamination, which follows cover sheet removal, the remaining layers 20, 24 of the dry film 21 very substantially conform to the irregular surface contours of the circuit board. In each case (5A and 5B), the thickness of the photoimageable layer 20 which was used to form the photomask was equal to or less than the elevation of the trace 16 or 16'; however, the surface of the circuit board is fully covered by the solder mask with the traces 16 or 16' fully encapsulated and encapsulated to an adequate thickness. It is to be noted that the photomask portions in the regions 26 of the knees of the traces are substantially as thick as photomask portions over the upper flat surfaces of the traces. When using a dry film in accordance with the present invention, the resulting solder mask has thickness in the regions 26 of the knees of the traces which is at least about 70% of the thickness of the solder mask over the upper flat surface of the traces (over more than about 90% of the linear length of the traces). It is also to be noted in FIG. 5B where a trace 16' has overhangs 28, conformance of the layer 20 during vacuum/heat lamination is sufficient to substantially remove air-filled voids from below the overhangs 28. Even though substantial deformation of the photoimageable composition layer 20 is required to achieve this conformance, the top coat 24 maintains its integrity during lamination.

Subsequent to lamination, the solder mask is formed by processing the layer of photoimageable composition in a conventional manner. Artwork is laid over the remaining layers 20, 24 of the dry film; the top coat 24 prevents the artwork from sticking.

The photoimageable composition layer 20 is exposed to patterned actinic radiation through the protective top coat 24. Although resolution is generally not as critical when developing solder masks as it is in developing photoresist layers, the thinness of the top coat 24, typically in the range of about 2–3$\mu$ (as opposed to a cover sheet, typically in the range of about 25$\mu$, through which photoimageable composition layers 20 of conventional solder mask-forming dry films 12 must be exposed) contributes to improved resolution. Further contributing to enhanced resolution is the relative thinness of the photoimageable composition layer 20 itself. As noted above, with a conventional solder mask-forming dry film 12, which is intended to be exposed through the cover sheet 18, the photoimageable composition layer typically must cover traces 16 with elevation of 50$\mu$ or more, and the photoimageable composition layers are typically about 100$\mu$ thick. Because the photoimageable composition layer 20 of the dry film of the present invention is conformable to the surface contours of the circuit board 10, a thickness of 50$\mu$ or less is sufficient to cover traces elevated 50$\mu$ and even up to about 75$\mu$ above the flat surface of the board 14. Of course, a further advantage is substantially reduced levels of expensive photoimageable composition used to form the layer 20.

An additional advantage of a thin, conforming photoimageable layer is that the solder mask which forms in the regions between the traces 16 is generally at or below the level of the traces. With conventional solder masks, slight elevated regions exist between the traces. Such elevated regions may result in the component, which is being soldered, sitting high on the solder mask and preventing pins of the component from being adequately soldered to exposed trace portions. Alternatively, the elevated regions may, during reflow, result in some of the pins of a soldered component breaking contact, causing the component to stand up at one end, an effect known as "tombstoning". Inadequate soldered contact and "tombstoning" are avoided when "valleys" instead of elevated regions exist between exposed portions of the traces.

After exposure to actinic radiation, the layers 20 and 24 are developed, the developer removing the top coat 24 and appropriate portions of the photoimaged layer 20.

In addition, the dry film solder mask of this invention has the same ability to "tent" via holes as conventional primary imaging or solder masks films. This is a very important part of the process and cannot be duplicated with simple liquid processes.

Generally, an additional cure follows development in order to harden the solder mask. Typically, heat and/or UV light are used to effect this cure.

The present invention is not primarily directed to materials from which the various sheets and layers are formed; and reference is again made to U.S. Pat. No. 4,530,896 and U.S. patent application Ser. No. 06/931,396 abandoned. The cover sheet 18 is generally formed of a polyester, such as PET and is generally at least about 25μ, or thicker, and up to about 75μ thick.

PET, if used for the support sheet, is preferably surface-treated to provide adequate hydrophilicity or wetting angle so that it does not adhere strongly to the top coat. Preferably, the wetting or contact angle of the cover sheet material is at least about 60° and is preferably 75° or less. One suitable PET cover sheet is sold under the trade designation Melinex-393 by ICI. This is a PET that is surface-treated on one side to enhance its hydrophilicity, i.e., increase its wetting angle.

Other suitable cover sheet materials include, but are not limited to polyamides, polyolefins, vinyl polymers, and cellulose esters.

Any photoimageable composition suitable for forming solder masks is suitable for practice of the invention.

The protective sheet 22 is selected to be removable from the photoimageable composition layer 20, and is typically a polyethylene sheet, between about 15μ and about 35μ thick.

The top coat 24 is formed of a material which provides the requisite selective adherence. The top coat is typically from about 1μ to about 12μ thick, typically between about 2μ and about 5μ. When using a PET cover sheet and a photoimageable material which is developable in aqueous or alkaline aqueous developer, a suitable top coat consists essentially of (a) between about 10 weight percent and 100 weight percent of either polyvinyl alcohol hydrolyzed to at least about 75% or a copolymer formed by the copolymerization of between about 95 and about 99 molar percent of polyvinyl acetate and between about 1 and about 5 molar percent of alkyl ester of acrylic acid and being hydrolyzed to at least about 75 percent; (b) up to about 90 weight percent of hydroxyethyl cellulose; and (c) up to about 10 weight percent of plasticizer. Preferably, hydroxyethyl cellulose is used at a level of at least 25 wt. percent and more preferably at a level of at least about 50 wt. percent.

The above described copolymers are sold under the trade designation VINOL-118 M by Air Products, and 4 weight percent solutions of these copolymers and have viscosities ranging from about 5 to about 65 centipoise at 20° C. PVC homopolymers of similar viscosity are useful as well. Commercially suitable PVA's are also sold by Air Products.

A plasticizer, if used, tends to lower the tack temperature of the top coat composition, and tack temperatures below about 100° C. have been achieved using such plasticizers. A top coat composition having a lower tack temperature is easier to adhere to the photoimageable layer. Preferred plasticizers are low molecular weight compounds, e.g., below about 200, having two or more hydroxyl groups, such as glycerine, ethylene glycol and propylene glycol. While plasticizers desirably lower the tack temperature, they also increase oxygen permeability of the top coat; accordingly amounts of plasticizers in excess of about 10% by weight are desirably avoided.

Other suitable materials for top coat use include, but are not limited to, the group consisting of polyvinyl ether-maleic anhydride copolymers, water-soluble cellulose ethers, water-soluble salts of caroboxyalkylcellulose, water-soluble salts of carboxyalkyl starch, polyvinyl alcohol, polyvinyl pyrolidone, various polyacrylamides, various water-soluble polyamides, water-soluble salts of polyacrylic acid, gelatin, ethylene oxide polymers, various starches and the like.

The method of forming the dry film is according to known procedures. The top coat and photoimageable composition layers are successively layered on the cover sheet by methods, such as roller coating or by spraying solutions or dispersions of the materials.

In a variation of the method of practice of the invention described above, a dry film may be laminated both before and after removal of the cover sheet. In the case where the photoimageable layer is about equal in thickness or of lesser thickness than the traces (or other unevenness of the board), one might expect the traces (or other unevenness of the board) to penetrate the photoimageable layer. However, it is found in such cases, that a conventional lamination of such a dry film using heat, vacuum and mechanical slap-down in a conventional manner results in tacking of the photoimageable layer to the upper surfaces of the traces (or other elevations) without penetration of the traces (or elevations) through the photoimageable layer. The tacking of the dry film over a greater area of the board facilitates its adhesion to the board during cover sheet removal. A second vacuum lamination with heat, vacuum, and mechanical slap-down after cover sheet removal acts to conform the photoimageable composition layer (and top coat) to the contours of the uneven board surface. In a typical procedure the lamination subsequent to cover sheet removal is for about half the time as the lamination prior to cover sheet removal, e.g., 30 seconds for the second lamination compared to 60 seconds for the first laminations. The additional tacking afforded by the initial lamination may prove to be particularly advantageous when using automated equipment for cover sheet removal.

Figure 12:
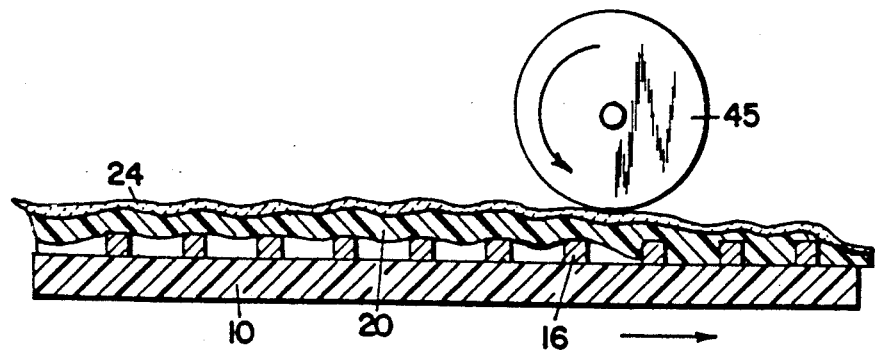
FIG. 12 is a diagrammatic illustration of the use of a roller to conform layers of dry film, from which the cover sheet has been removed, to the surface of the board.

As a further variation to the method of the invention, instead of using a heat/vacuum lamination process, subsequent to removal of the protective sheet 22 and the cover sheet 18, to conform the photoimageable layer 20 (and top coat 24) to the contours of the board surface, a roller applying mechanical pressure may be used to accomplish the same purpose. Illustrated diagrammatically in FIG. 12 is the use of the roller used to conform a photoimageable layer 20 and top coat 24 to the contours of the board. In this diagram, the board 10 and layers 20, 24 of a dry film are moved from left to right below a non-driven roller 45 with the roller in pressure bearing contact with the top coat 24. As in the processes described above, the dry film is first tacked down. Preferably, the dry film is then vacuum laminated to the board 10. In the case where the dry film has a thin photoimageable layer 20 relative to the height of the traces, the layers 20, 24 of the dry film for the most part sit on the top surfaces of the traces 16 as seen at the left-hand side of FIG. 12. After passing below the roller 45, the photoimageable composition 20 and top coat 24 conform to the contours of the board 10 with traces 16 as seen on the right-hand side of FIG. 12. The layers 20, 24 are pressed down across the full surface of the board 10 as the board passes below the roller. Alternatively, a roller could be drawn across the surface of a stationary board.

The roller 45 used for this purpose should apply between about 1 bar and about 6 bar pressures. The roller 45 is heated depending on the particular application to between 40° and 110° C., generally in the rage of 60° to 80° C. The surface of the conforming roller 45 has some resiliency, preferably being a polymeric material having a Shore A hardness of between about 60 and about 80. The surface of the roller is smooth. The relative speed of the roller 45 and board 10 will vary according to the application, generally between about 1 and about 10 meters per second, 3 meters per second being typical.

The invention will now be described in greater detail by way of specific examples.

EXAMPLE 1

A dry film is prepared in accordance with the invention having a cover sheet which is a 50μ thick sheet of PET, a 2.5μ top coat which is 10 weight percent of the hydrolyzed polyvinyl acetate/acrylic acid copolymer described above, and 90 weight percent hydroxyethyl cellulose, a photoimageable composition forming a layer 50μ thick and a polyethylene protective sheet 25μ thick. The photoimageable composition is formulated as follows:

| Weight % | Ingredients: Chemical Name or Trade Name |
|---|---|
| 36.5 | Scripset 540 (styrene/Maleic Anhydride Co-Polymer |
| 25.8 | MEK |
| 1.2 | Pigment CI 7426 |
| 0.05 | Sterically hindered phenol anti-oxidant |
| 7.54 | Tripropylene glycol diacrylate |
| 3.76 | Tripropylene propane triacrylate |
| 0.33 | Adhesion Promoter of the Thiazole type |
| 2.81 | N-Methylolacrylamide |
| 2.26 | Dimethoxyphenyl Acetophenone |
| 0.56 | Coating Aid |
| 1.18 | Methyl Ethyl Ketone |
| 18.01 | Fillers |
| 100% | |

EXAMPLE 2

A dry film is prepared in accordance with Example 1, using LAMINAR ® DM to form the photoimageable composition layer.

EXAMPLE 3

Panels having copper traces and plates having tin/lead traces were each cleaned in a conventional manner. The dry film of Example 2 was applied to the boards both manually and with an automated system. Manually, the polyethylene protective sheet was removed and the four corners of the film were tacked down with only finger pressure. Using tape to obtain a grip, the cover sheet was removed by drawing off the PET cover sheet in a plane parallel to the board surface. In the automated variation, a Dynachem DFSM Model 360 laminator was used. The Dynachem apparatus uses an "off contact" method which automatically removes the polyethylene protective sheet, tacks down the leading edge of the dry film and then tacks down the trailing edge of the dry film. Application was to both sides of the boards. Then the cover sheet was removed.

Lamination was effected at a platen temperature of 70° C. with a cycle time of 60 seconds and a vacuum of 2 millibars. Mechanical slapdown was for 6 seconds at a vacuum of 0.3 millibar. The boards were held 20-30 minutes.

Artwork was laid over the boards. Using Colight DMVL-824, exposure was for 25 seconds at 100 mJ/cm$^2$ measured by Dynachem's integrating radiometer model 500, achieving a Stouffer step of 8 to 9. The boards were held for an additional 20-30 minutes. The boards were developed in 1.0 weight percent $Na_2CO_3 \cdot H_2O$ which gave a 2× break point. The boards were dried using a Chemcut 547 circuit board dryer. Curing was done using a Dynachem UVEX curing unit, an IL-390 unit and a high temperature oven. Curing steps are as follows:

U.V. CURING
1. UVEX-3 lamp (200 watt/inch).
2. 3.5 Joules/cm$^2$ (IL-390) side A.
3. Cool to room temperature.
4. 3.5 Joules/cm$^2$ (IL-390) side B.
5. Cool to room temperature.

THERMAL CURE
1. Oven bake at 150° C. for 60 minutes.

EXAMPLE 4

Figure 6:
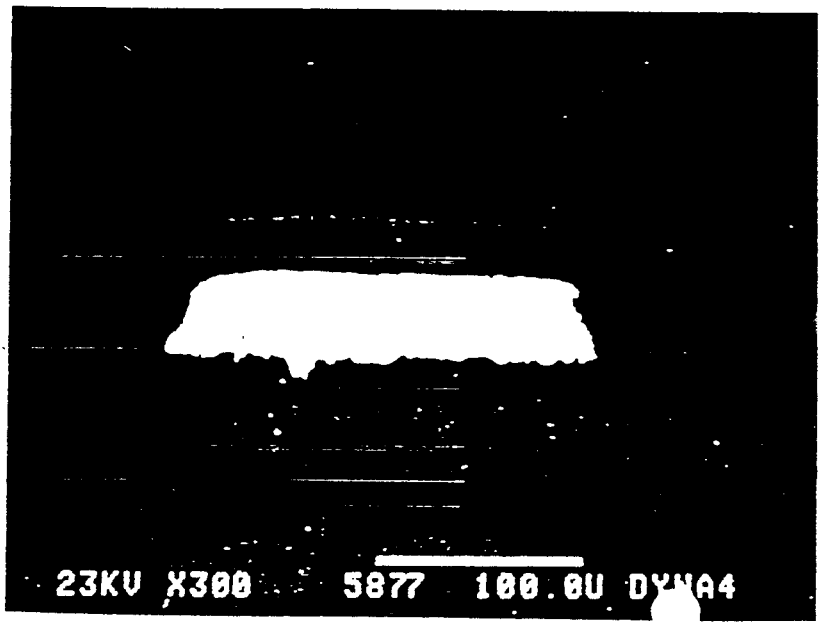
FIGS. 6-9 are each photographs of a perpendicular slice of a printed circuit board having a solder mask prepared using a dry film in accordance with the present invention, the photographs being taken at an angle of 60° relative to the plane of the board so as to show both the cross-section of the board and the outer surface of the photomask.

FIG. 6 shows a solder mask formed from a 50μ layer encapsulating a 50μ trace.

Figure 7:
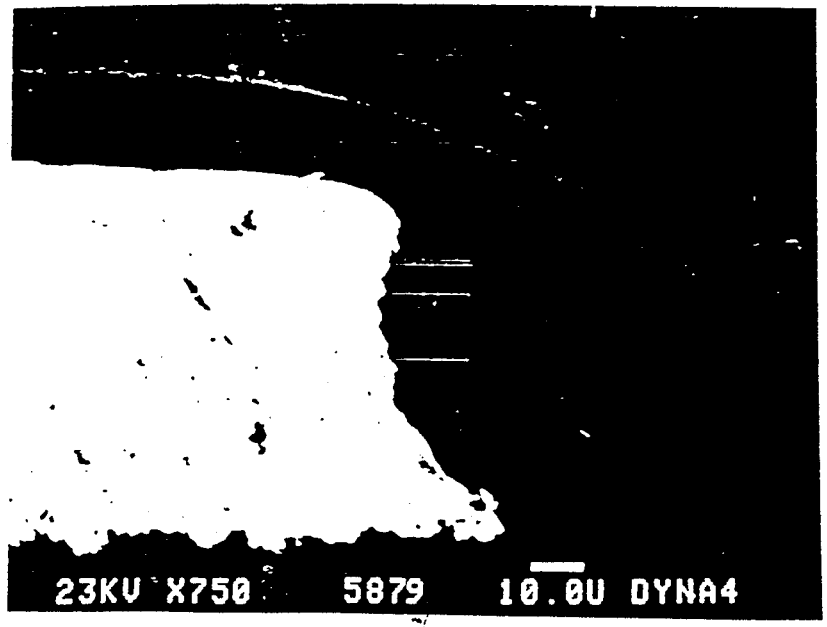

FIG. 7 shows a solder mask formed from 50μ layer encapsulating a 75μ high trace. Excellent coverage at the regions of the knees is seen.

Figure 8:
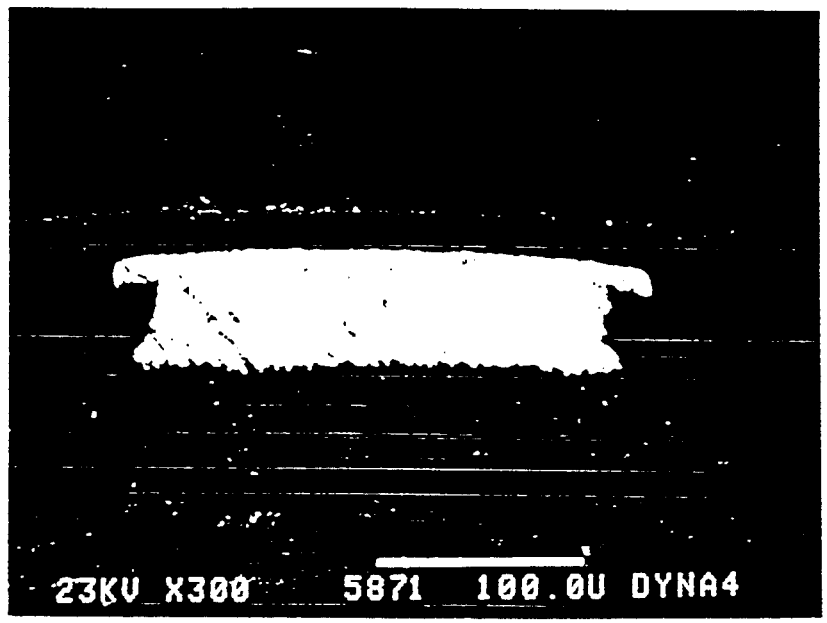

FIG. 8 shows a solder mask formed from a 50μ layer encapsulating a 50μ high trace having overhangs. Solder mask material filling the regions below the overhangs is seen.

Figure 9:
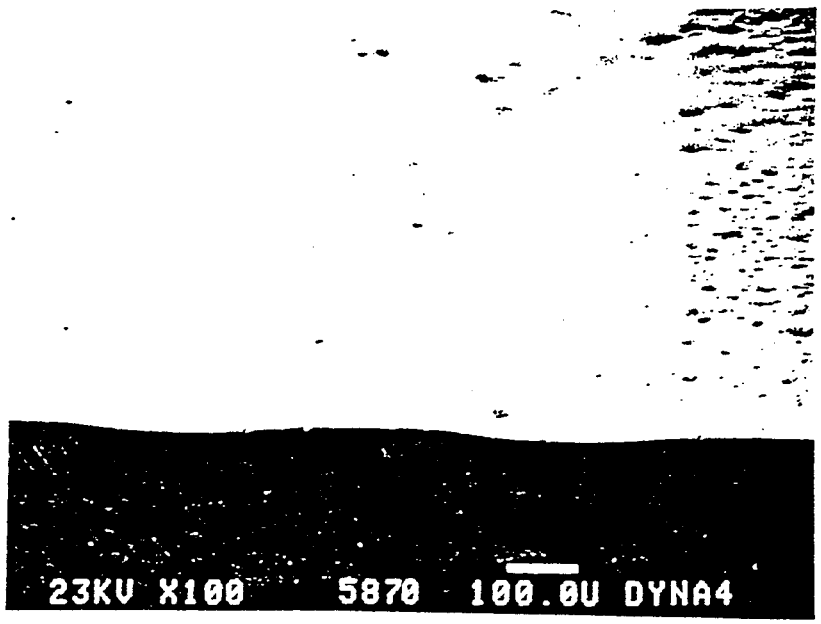

FIG. 9 shows a solder mask formed from a 50μ layer encapsulating 50μ high trace. Conformance of the solder mask to the contours of the circuit board is seen.

Although the invention is most pertinent to and has been described primarily in respect to a dry film carrying a photoimageable composition layer which is curable to form a solder mask, the invention is generally applicable to a dry film having any primary imaging product, including primary photoresists, to be applied to an irregular surface, particularly a surface from which traces rise from an otherwise flat surface. It may also be desirable to use the method of the present invention to apply a layer of primary photoresist to a copper surface with unevenness caused by "fatglass". There are instances, for example, where it is desirable to lay a photoresist layer over a patterned circuit which is already formed and then either add or subtract existing copper patterns or tab plate gold fingers.

EXAMPLE 5

Figure 10:
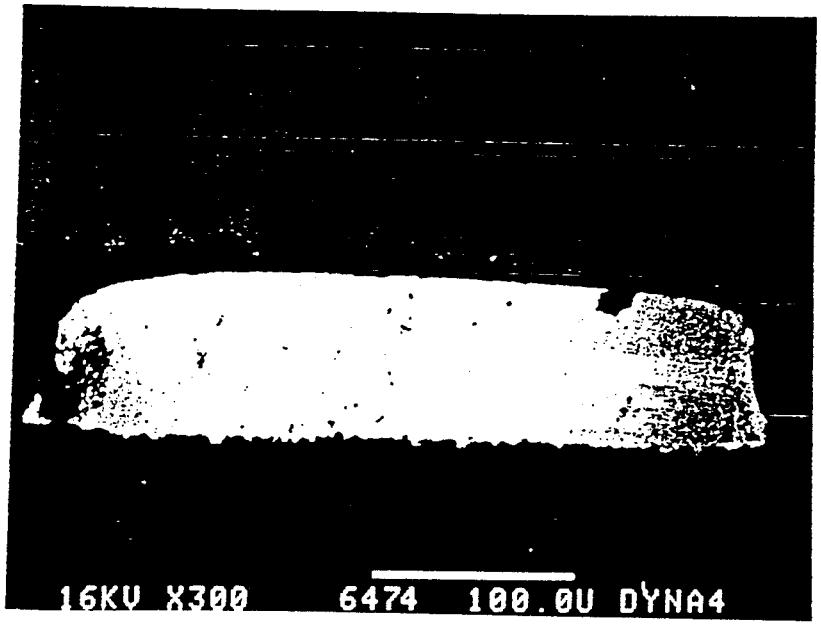
FIG. 10 is a 300× magnification of a primary photoresist applied by the method of the present invention over a circuit board having traces.

A dry film is prepared in accordance with Example 1, using Laminar ® AX to form a photoimageable composition layer. The resist was laminated over raised connector tabs, as per Example 3, and exposed to an image to a solid copper 7-9 on a Stouffer ® 21 Step Sensitivity guide. A covered trace is seen in FIG. 10. The exposed panel was then developed in a Chemcut 547 spray developer containing 91 liters water, 3% by weight potassium carbonate and 1 to 5% Butyl Cellosolve ® which bared about ¾ of each connector pad. Developer temperature was held between 27°-33° C. After thorough rinsing, the board given a 0.30 mil nickel strike followed by 30 min. gold plating cycle in a Technic RC-80 bath. The resist was then stripped in a 3-5% NaOH at 54°-60° C. The gold plated tabs were then inspected for wicking in the areas around which the resist had conformed. No traces of Au or Ni were found anywhere above the gold plated areas. A control, not vacuum laminated in this fashion, showed wicking on about 25% of the tabs.

The excellent conformability achieved by the laminated dry film in accordance with the present invention might also be achieved with a dry film comprising a layer of photoimageable material backed by a cover sheet of deformable material, e.g., heat-conforming vacuum film. Such a dry film would be applied in the manner of conventional film, heat/vacuum laminating being effected either during or subsequent to application to the circuit board. The cover sheet, in this case, would provide the desired conformance; handling problems of the more flexible sheet might be encountered.

In a variation of the method of the present invention, after the cover sheet is removed and prior to vacuum/heat lamination, a flexible sheet, e.g., Tedlar or Teflon, is laid over the top coat. During vacuum lamination, the flexible sheet conforms to the top coat, but can be and is removed prior to or after exposure to allow development. A reason for applying such a flexible sheet is to lengthen the permissible period of time between lamination and exposure of the photoimageable layer. Flexible sheet material may be a polymeric material or a thin sheet of paper.

While the method of the invention has been described primarily in terms of a dry film comprising a cover sheet, a top coat on the cover sheet, and a layer of photoimageable composition on the top coat, the method of the invention may be practiced using a conventional dry film comprising a cover sheet and a photoimageable composition layer, e.g., either a primary imaging photoresist or a solder mask-forming photoimageable composition which is in direct contact with the cover sheet. Such a conventional dry film may optionally contain a protective sheet covering the photoimageable comparison layer. The method may be practiced with a conventional dry film, provided that the layer of photoimageable composition tacks to a surface with sufficient adhesion relative to the adhesion between the photoimageable composition and the cover sheet that the cover sheet may be removed from the photoimageable composition layer, leaving the photoimageable composition layer tacked to the surface. After the cover sheet is removed, the photoimageable composition layer may be covered by a sheet of flexible material, such as Tedlar or Teflon (polytetrafluoroethylene). Such a flexible material facilitates contact printing and prevents the photoimageable composition layer from sticking to parts of the vacuum laminator. Alternatively, blankets in the vacuum laminator may consist of flexible materials. The photoimageable composition layer is laminated to the surface with heat and vacuum, conforming the photoimageable composition layer to the surface. The photoimageable composition layer is exposed to patterned actinic radiation, e.g., by off-contact printing, such as by means of a Tamarack Exposure source. If a flexible sheet has been applied, it is removed, either before or after exposure. The photoimageable composition layer is then developed. If the photoimageable layer is a solder mask-forming composition, it is cured.

EXAMPLE 6

The following is a specification of a finely textured resilient blanket in accordance with the present invention.

Product Construction: Silicone rubber (methylvinyl) balanced coated onto fiberglass fabric, matte finish one side.

Product Color: Red:

Product Features: a. Fine matte finish on one side, smooth the other.
  b. Dimensional stability.
  c. High break strength.
  d. High temperature resistance and release properties of silicone.

| PHYSICAL PROPERTIES | |
|---|---|
| Thickness, in. (±.005") | 1/16 |
| Fiberglass Style | 1564 |
| Fiberglass Thickness, in. | .015 |
| Rubber Durometer, Shore "A" | 60 |
| Break Strength, ppi (Warp Direction) | 450 |
| Hydrostatic Burst Strength, psi | 750 |
| Weight Loss, % (Heat Aged 4 hours @ 400° F.) | 1.5 |

While the invention has been described in terms of certain preferred embodiments, modifications which would be obvious to one with ordinary skill in the art may be made without departing from the scope of the invention.

Various features of the present invention are set forth in the following claims.

What is claimed is:

1. A method of forming a photoimaged layer on an uneven substrate surface, the method comprising:
  (A) providing a dry film comprising a cover sheet and a layer of photoimageable composition on said cover sheet;
  (B) tacking said photoimageable composition layer to said substrate surface;
  (C) removing said cover sheet from said photoimageable composition layer, leaving said photoimageable composition layer tacked to said substrate surface;
  (D) causing a heated roller to pass across said photoimageable composition layer applying pressure thereto, thereby causing said photoimageable layer to conform to said substrate surface;
  (E) exposing said photoimageable composition layer to patterned actinic radiation; and
  (F) developing said photoimageable composition to remove either exposed or unexposed portions from said substrate surface, leaving either unexposed or exposed portions remaining on said substrate surface.

2. A method according to claim 1 wherein said heated roller applies a pressure of between about 1 and about 6 bars.

3. A method according to claim 1 wherein said roller is heated to a temperature of between about 40° and about 100° C.

4. A method according to claim 1 wherein the surface of said roller is resilient material of between about 60 and about 80 Shore A hardness.

5. A method of forming a solder mask on the surface of a printed circuit board, the method comprising:

(A) providing a dry film comprising
  (1) a cover sheet, and
  (2) a layer of photoimageable composition on said cover sheet, which photoimageable composition is curable after exposure and development to provide a hard, permanent solder mask overlying the printed circuit board;
(B) tacking said photoimageable composition layer to the surface of said printed circuit board;
(C) removing said cover sheet from said photoimageable composition layer, leaving said photoimageable composition layer tacked to the surface of said circuit board;
(D) causing a heated roller to pass across said photoimageable composition layer applying pressure thereto, thereby causing said photoimageable composition layer to conform to the surface of said printed circuit board;
(E) exposing said photoimageable composition layer to patterned actinic radiation;
(F) developing said photoimageable composition to remove either exposed or unexposed portions from said printed circuit board, leaving either unexposed or exposed portions remaining on said printed circuit board; and
(G) curing said remaining portions of said photoimageable composition layer to form a hard, permanent solder mask protecting said printed circuit board.

6. A method of forming a photoimaged layer on an uneven substrate surface, the method comprising:
(A) providing a dry film comprising
  (1) a cover sheet,
  (2) a top coat on said cover sheet, and
  (3) a layer of photoimageable composition on said top coat; said top coat being selectively adherent to said photoimageable composition relative to its adherence to said cover sheet;
(B) tacking said photoimageable composition layer to said substrate surface;
(C) laminating said photoimageable composition layer to said substrate surface using heat, vacuum and mechanical pressure;
(D) removing said cover sheet from said top coat, leaving said photoimageable composition layer tacked to said substrate surface with said top coat covering and protecting said photoimageable composition layer;
(E) causing a heated roller to pass across said photoimageable composition layer applying pressure thereto and causing said photoimageable composition layer to conform to said substrate surface;
(F) exposing said photoimageable composition layer to patterned actinic radiation; and
(G) developing said photoimageable composition layer to remove either exposed or unexposed portions from said substrate surface, leaving either unexposed or exposed portions remaining on said substrate surface.

7. A method of forming a solder mask on the surface of a printed circuit board, the method comprising:
(A) providing a dry film comprising
  (1) a cover sheet;
  (2) a top coat on said cover sheet, and
  (3) a layer of photoimageable composition on said top coat, which photoimageable composition is curable after exposure and development to provide a hard, permanent solder mask overlying the printed circuit board; said top coat being selectively adherent to said photoimageable composition relative to its adherence to said cover sheet;
(B) tacking said photoimageable composition layer to the surface of said printed circuit board;
(C) laminating said photoimageable layer to the surface of said printed circuit board using heat, vacuum and mechanical pressure;
(D) removing said cover sheet from said top coat, leaving said photoimageable composition layer tacked to the surface of said circuit board with said top coat covering and protecting the same;
(E) causing a heated roller to pass across said photoimageable composition layer applying pressure thereto and causing said photoimageable composition layer to conform to the surface of said printed circuit board;
(F) exposing said photoimageable composition layer to patterned actinic radiation;
(G) developing said photoimageable composition to remove either exposed or unexposed portions from said printed circuit board, leaving either unexposed or exposed portions remaining on said printed circuit board; and
(H) curing said remaining portions of said photoimageable composition layer to form a hard, permanent solder mask protecting said printed circuit board.

8. A method of forming a photoimaged layer on an uneven substrate surface, the method comprising:
(A) providing a dry film comprising
  (1) a cover sheet;
  (2) a top coat on said cover sheet, and
  (3) a layer of photoimageable composition on said top coat; said top coat being selectively adherent to said photoimageable composition layer relative to its adherence to said cover sheet;
(B) tacking said photoimageable composition layer to said substrate surface;
(C) laminating said photoimageable composition layer to said substrate surface using heat, vacuum and mechanical pressure;
(D) removing said cover sheet from said top coat, leaving said photoimageable composition layer tacked to said substrate surface with said top coat covering and protecting said photoimageable composition layer;
(E) laminating said photoimageable composition layer to said substrate surface, using heat, vacuum and mechanical pressure to conform said photoimageable composition layer and said top coat to said substrate surface;
(F) exposing said photoimageable composition layer to patterned actinic radiation; and
(G) developing said photoimageable composition layer to remove either exposed or unexposed portions from said substrate surface, leaving either unexposed or exposed portions remaining on said substrate surface.

9. A method of forming a solder mask on the surface of a printed circuit board, the method comprising:
(A) providing a dry film comprising
  (1) a cover sheet,
  (2) a top coat on said sheet, and
  (3) a layer of photoimageable composition on said top coat, which photoimageable composition is curable after exposure and development to provide a hard, permanent solder mask overlying the printed circuit board; said top coat being selectively adherent to said photoimageable composition relative to its adherence to said cover sheet;

(B) tacking said photoimageable composition layer to the surface of said printed circuit board;

(C) laminating said photoimageable layer to the surface of said printed circuit board using heat, vacuum and mechanical pressure;

(D) removing said cover sheet from said top coat, leaving said photoimageable composition layer laminated to the surface of said circuit board with said top coat covering and protecting the same;

(E) laminating said photoimageable composition layer to the surface of said printed circuit board, using heat, vacuum and mechanical pressure to conform said photoimageable composition layer and said top coat to the surface thereof;

(F) exposing said photoimageable composition layer to patterned actinic radiation;

(G) developing said photoimageable composition to remove either exposed or unexposed portions from said printed circuit board, leaving either unexposed or exposed portions remaining on said printed circuit board; and (H) curing said remaining portions of said photoimageable composition layer to form a hard, permanent solder mask protecting said printed circuit board.

10. A method according to claim 9 wherein said conforming laminating step E is carried out for about half the time as said laminating step (C).

11. A method according to claim 9 wherein in step B said photoimageable composition layer is tacked to the leading and trailing edges of the printed circuit board.

12. A method according to claim 9 wherein said lamination steps C and E are each carried out at a temperature of between about 40° C. and about 100° C. and a vacuum of at least about 1 millibar.

13. A method according to claim 9 wherein the thickness of said photoimageable layer is about equal to or less than the elevation of traces on said printed circuit board.

* * * * *